(12) United States Patent
Lee et al.

(10) Patent No.: US 6,884,729 B2
(45) Date of Patent: Apr. 26, 2005

(54) GLOBAL PLANARIZATION METHOD

(75) Inventors: Jui-Kun Lee, Hoffman Estates, IL (US); Chris C. Yu, Conneautville, PA (US); David G. Mikolas, Rowland Heights, CA (US)

(73) Assignee: Cabot Microelectronics Corporation, Aurora, IL (US)

( * ) Notice: Subject to any disclaimer, the term of this patent is extended or adjusted under 35 U.S.C. 154(b) by 96 days.

(21) Appl. No.: 10/193,589

(22) Filed: Jul. 11, 2002

(65) Prior Publication Data

US 2003/0151020 A1 Aug. 14, 2003

Related U.S. Application Data

(60) Provisional application No. 60/356,269, filed on Feb. 11, 2002.

(51) Int. Cl.[7] ............................................... H01L 21/302
(52) U.S. Cl. .................. 438/704; 438/692; 438/694; 438/725; 216/88
(58) Field of Search ......................... 216/88, 89; 430/5; 438/692, 693, 694, 704, 725

(56) References Cited

U.S. PATENT DOCUMENTS

| | | |
|---|---|---|
| 4,789,648 A | 12/1988 | Chow et al. |
| 4,956,313 A | 9/1990 | Cote et al. |
| 5,137,544 A | 8/1992 | Medellin |
| 5,157,876 A | 10/1992 | Medellin |
| 5,209,816 A | 5/1993 | Yu et al. |
| 5,244,523 A | 9/1993 | Tollini |
| 5,340,370 A | 8/1994 | Cadien et al. |
| 5,354,490 A | 10/1994 | Yu et al. |
| 5,391,258 A | 2/1995 | Brancaleoni et al. |
| 5,476,606 A | 12/1995 | Brancaleoni et al. |
| 5,527,423 A | 6/1996 | Neville et al. |
| 5,529,954 A * | 6/1996 | Iijima et al. ................. 438/653 |
| 5,540,811 A * | 7/1996 | Morita ....................... 438/634 |
| 5,663,107 A | 9/1997 | Peschke et al. |
| 5,783,489 A | 7/1998 | Kaufman et al. |
| 5,792,707 A | 8/1998 | Chung |
| 5,954,997 A | 9/1999 | Kaufman et al. |
| 5,993,686 A | 11/1999 | Streinz et al. |
| 6,004,653 A * | 12/1999 | Lee ............................. 428/141 |
| 6,015,506 A | 1/2000 | Streinz et al. |
| 6,015,755 A | 1/2000 | Chen et al. |
| 6,033,596 A | 3/2000 | Kaufman et al. |
| 6,039,891 A | 3/2000 | Kaufman et al. |
| 6,063,306 A | 5/2000 | Kaufman et al. |
| 6,063,702 A | 5/2000 | Chung |
| 6,068,787 A | 5/2000 | Grumbine et al. |
| 6,093,656 A | 7/2000 | Lin |
| 6,103,581 A | 8/2000 | Lin et al. |
| 6,121,143 A | 9/2000 | Messner et al. |
| 6,319,837 B1 * | 11/2001 | Chittipeddi et al. ......... 438/692 |
| 6,366,500 B1 * | 4/2002 | Ogura et al. ........... 365/185.29 |
| 6,387,810 B1 * | 5/2002 | Beardsley et al. .......... 438/691 |

* cited by examiner

*Primary Examiner*—George A. Goudreau
(74) *Attorney, Agent, or Firm*—A. Blair Hughes

(57) ABSTRACT

Methods for manufacturing substrates with difficult to polish features using reverse mask etching and chemical mechanical planarization techniques.

30 Claims, 5 Drawing Sheets

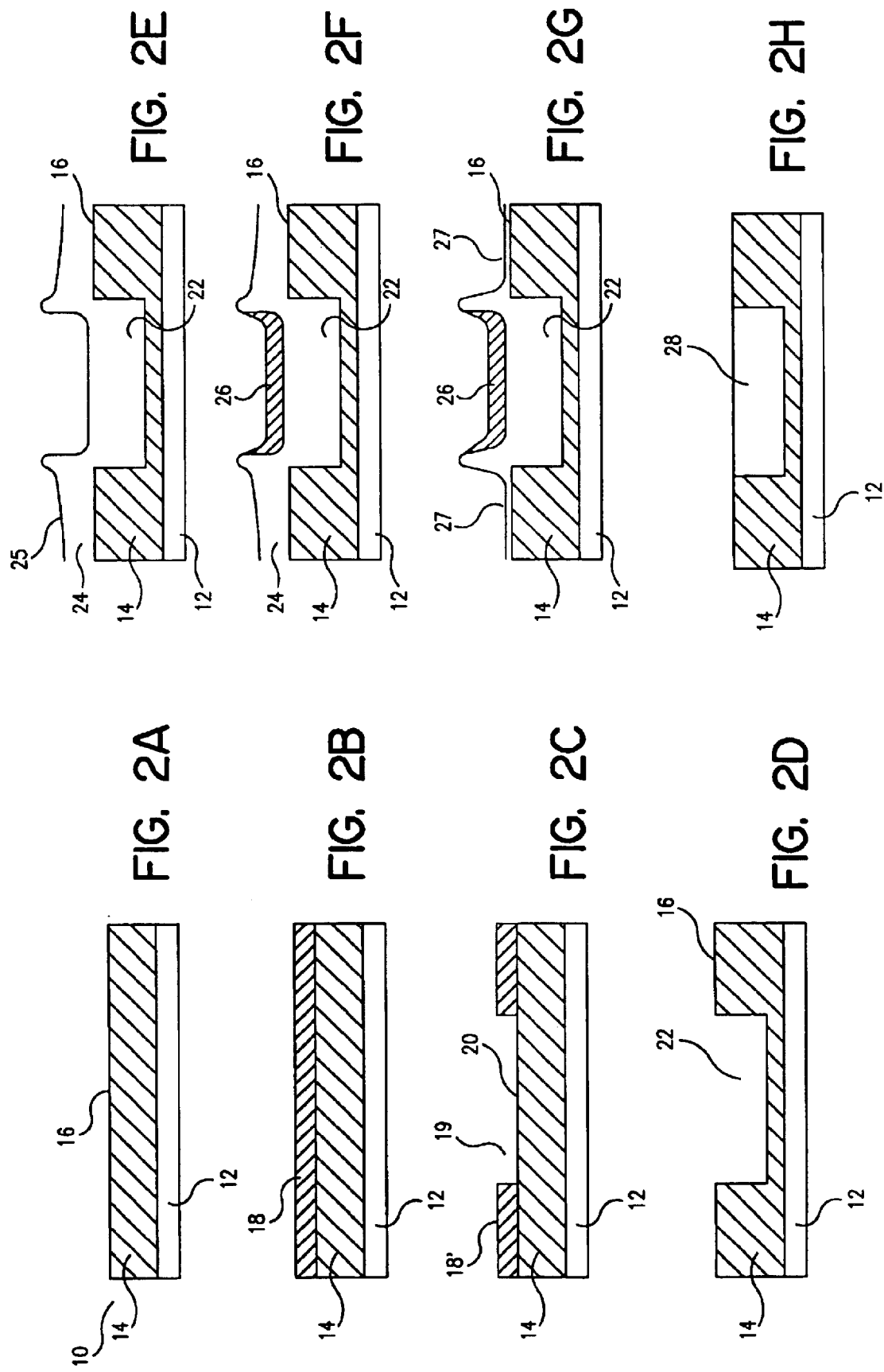

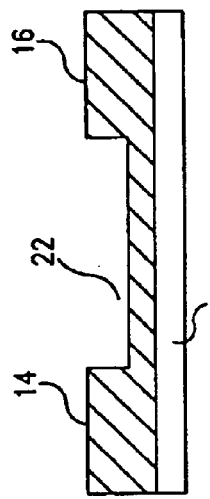
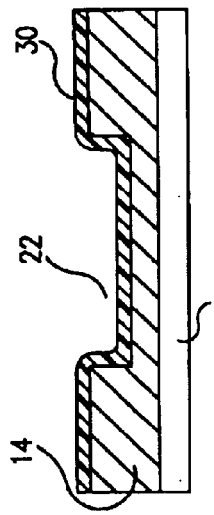
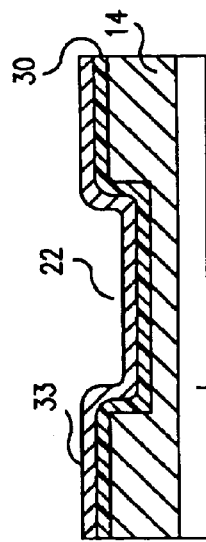
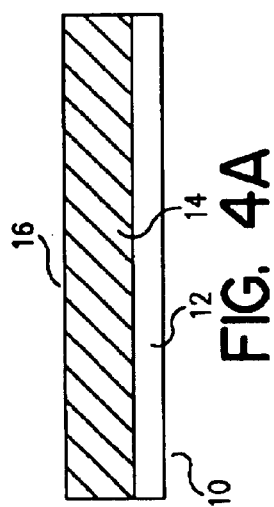
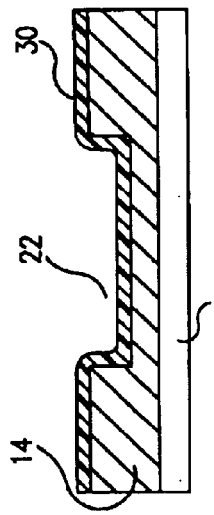
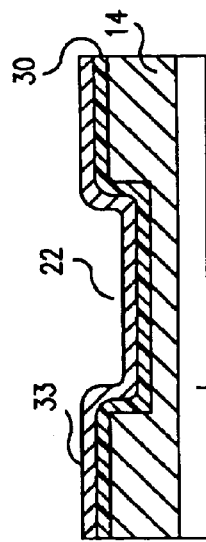

GLOBAL PLANARIZATION METHOD

BACKGROUND OF THE INVENTION

(1) Field of the Invention

This invention concerns methods for manufacturing substrates with large or difficult to planarize features such as large step height features, large width features or features of varying pattern densities. Such difficult to polish features are found in substrates such as photonic light circuits (PLC's) and micro-electro-mechanical systems (MEM's) which are also known as microelectromechanisms. The methods of this invention employ reverse mask etching and chemical mechanical polishing (CMP) techniques to planarize the difficult to polish feature with little dishing and with little edge loss.

(2) Description of the Art

Manufacturing processes for integrated circuits are well known in the art. Integrated circuits are typically formed on a substrate by the sequential deposition of conductive, semiconductive or insulating layers onto a silicon wafer. After deposition, each layer can be etched to create circuitry features. Integrated circuit fabrication processes generally require a subsequent layer to be deposited upon a planar surface of a previous layer. Chemical mechanical planarization (CMP) is used to planarize an integrated circuit layer in order to prepare it for the deposition of a subsequent layer.

The procedures used to manufacture integrated circuits are only starting to be applied to the manufacture of other electronic devices such as photonic light circuits (PLC's) and microelectronic mechanism (MEM's). However, the size (width and depth) and densities of features applied to such substrates are very different that features applied to IC's. This makes it impossible to use chemical mechanical polishing to planarize certain substrate layers without introducing undesirable effects and features such as dishing. During CMP of MEM's and PLC's, localized differences in polish pressure cause small features to polish faster than wider gaps, and oxide layers applied to narrow features polish slower than oxide applied to larger features in the same deposition step. Due to the high feature precision requirements of substrates such as PLC's and MEM's, undesirable features caused by CMP are a major and unsolved problem.

FIGS. 1A–1D are cross-section views of embodiments of electronic devices that include features that are currently difficult to planarized by CMP. FIG. 1A is an electronic substrate cross-section that includes a large width feature 100 that is associated with a plurality of features 102 having very small widths. The substrate is covered by a deposited material 104 that fills large width feature 100 and small width features 102 and is to be planarized by CMP. The typical result of CMP of the substrate of FIG. 1A is shown in FIG. 1B. FIG. 1B depicts a substrate 100 including material 104 located above-large width feature 100 is dished to a greater extent thereby leaving the substrate with an unacceptable deviation from planarity. Dishing of the large density of small width features also occurs and usually results in dissimilar trench depths. The dishing occurs primarily because material 104 applied over large width feature 100 typically has a thickness H1 that is less than the thickness H2 of material 104 above the plurality of narrow features 102. Furthermore, polishing material 104 until it is planar with the surface of substrate 101 often causes the corners 105 associated of large width feature 100 to become rounded. Such rounded corners are undesirable for most electronic substrates including photonic light circuits which require features with sharp edges to minimize undesirable features in subsequently applied layers and to improve the efficiency of subsequent lithography steps.

Problems also occur when applying CMP techniques to add a large step height features to electronic substrates. FIG. 1C shows an electronic substrate including a large step height feature 110. Large step height feature 110 will typically have a height of from 2 to about 50 microns. In order to deposit a layer of material 111 into large step height feature 110, the step height H3 (the peak to valley height) of the top surface of material applied to the surface of the substrate and into large step height feature 110 can be quite large. Using CMP material 111 to planarize it with the surface 112 of substrate 109 is very difficult because using CMP to polish a thick layer of material causes dishing 113 and undesirably rounded corners 114 at the junction of the large step height feature 110 and substrate surface 112.

As integrated circuit manufacturing techniques are applied to larger and more diverse electronic substrates such as PLC's and MEM's, there remains a need for processes and techniques for planarizing the surfaces of such substrates without substantial deviation from planarity.

SUMMARY OF THE INVENTION

In one aspect, this invention includes methods for adding at least one feature to a substrate. The method begins with a substrate having a base material layer and a first material layer applied on top of the base material layer wherein the first material layer has a thickness of at least 2 microns and wherein the first material layer has an exposed surface. A first photosensitive etch resistant material layer is deposited onto the exposed surface of the first material layer. A first mask is placed on first photosensitive etch resistant material layer surface wherein the first mask covers portions of the first photosensitive etch resistant material layer to form covered portions of the photosensitive etch resistant material layer and wherein the first mask leaves portions of the first photosensitive etch resistant material layer exposed to form exposed portions of the first photosensitive etch resistant material layer. The exposed portions of the photosensitive etch resistant material layer is activated to give activated portions and non-activated portions of the first photosensitive etch resistant material layer. A portion of the first photosensitive etch resistant material layer is removed to expose the underlying first material layer. Next, the exposed first material layer is etched to a predetermined thickness to form a feature. The remaining first photosensitive etch resistant material layer is removed from the substrate to expose the entire first material layer surface. Then a second material layer is deposited onto the surface of the first material layer in an amount that is sufficient to fill the first material layer feature. A second photosensitive etch resistant material layer is deposited onto the exposed surface of the second material layer. A second mask is placed over the second photosensitive etch resistant material layer to form exposed portions of second photosensitive etch resistant material layer and unexposed portions of second photosensitive etch resistant material layer. The exposed portions of the second photosensitive etch resistant material layer are activated to form activated and non-activated portions of the second photosensitive etch resistant material layer. The portion of the second photosensitive etch resistant material layer that does not lie above the feature to expose portions of the second material layer is removed, a portion of the exposed second material layer is stripped from the substrate to the optimized height, and the exposed surface of the substrate is planarized by chemical mechanical polishing.

DESCRIPTION OF THE FIGURES

FIGS. 2A–2H are steps in an embodiment of process of this invention for adding difficult to polish features to a substrate using reverse mask etching and CMP techniques;

FIGS. 4A–4M are steps in another alternative process embodiment of this invention.

DESCRIPTION OF THE CURRENT EMBODIMENT

Figure 1A:
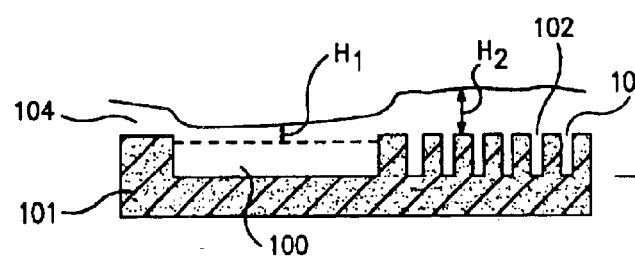
FIGS. 1A–1D are cross section views of electronic substrates showing the problems that are encountered when CMP is used to polish electronic substrates having difficult to polish features.
Figure 1B:
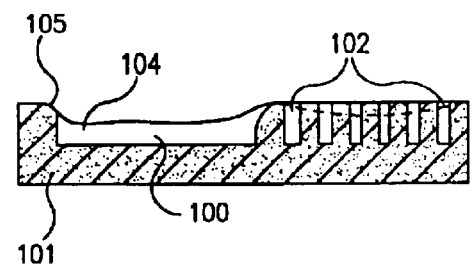
Figure 1C:
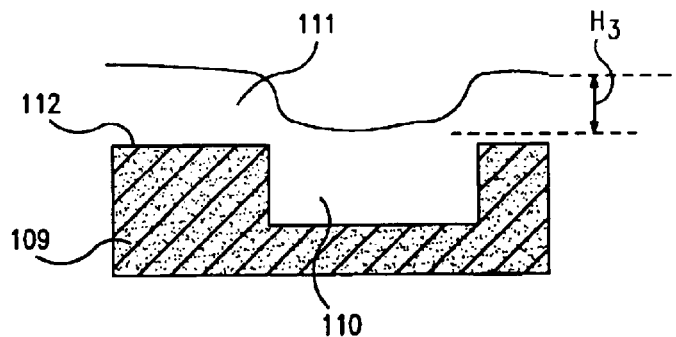
Figure 1D:
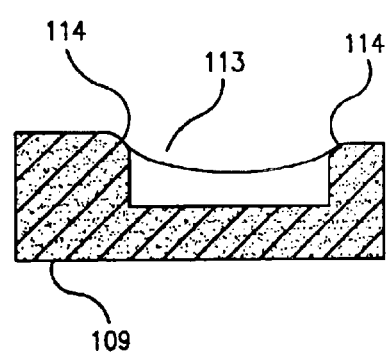

The present invention concerns methods for manufacturing substrates having features that create planarization difficulties. Such features include large step-height features, large width features, a low density of features in proximity to a high density of features, planarization of photonic light circuits that require good wall sharpness and combinations thereof. Substrates that can be manufactured by the processes of this invention include, but are not limited to, photonic light circuits (PLC's) and microelectromechanisms (MEM's).

FIGS. 2A–2H are steps in one embodiment of processes of this invention for manufacturing substrates with large step-height features. In FIG. 2A, a substrate 10 is provided that includes a base material layer 12 and a first material layer 14 applied to the top of base material layer 12. First material layer 14 further includes an exposed surface 16. Typically, a feature, such as a large step height feature, a large width feature, a photonic light circuit feature or a MEM feature will be applied to first material layer 14.

A first photosensitive etch resistant material 18 is applied to exposed surface 16 of first material layer 14 in FIG. 2B. The first photosensitive etch resistant material 18 may be any positive or negative photosensitive material or any other material that is used in integrated circuit manufacturing to apply a resist pattern to a substrate surface. The photosensitive etch resistant material should be resistant to the materials that are used to etch first material layer 14 which lies below etch resistant material layer 18. The thickness of first photosensitive etch resistant material layer 18 will depend upon a number of factors including, but not limited to, the etch material used and the expected etch time. The deeper the feature that is being etched into first material layer 14, the thicker the photoresist layer 18 must be to protect the covered areas from being etched. If photoresist layer 18 is too thick problems arise in applying an etch resistant material layer of uniform thickness. It becomes difficult to form sharp edges in the underlying material that is being etched.

FIG. 2C shows substrate 10 after the lithography step, i.e., after a mask has been applied to first photosensitive etch resistant material layer 18 to form patterned openings 19 in etch resistant material layer 18. Openings 19 exposes or protects areas of first material layer surface 20 which are to be subsequently removed or protected from removal. This lithography step can be performed using a reversed mask of the underlying structure or by using the identical mask of the underlying structure and changing from a positive to a negative photoresist material and vice versa. In the lithography step, the masked surface is activated by exposure to light, heat or any other form of energy that is necessary to interact with the photosensitive etch resistant material layer 18 in a positive or negative matter. After activation, the activated or non-activated portions of first photosensitive etch resistant material layer 18 are removed from first material layer 14 to form openings 19 that expose a portion of first material layer 20.

In FIG. 2D, exposed first material layer portions 20 of FIG. 2C are etched down a predetermined thickness to form a trench 22. After trench 22 is formed, the remaining first photosensitive etch resistant material layer 18 can be removed from substrate 10. If first material layer 14 is selected from a matter that has photosensitive characteristics, then the etch resistant material layer is not required and the mask described above will be applied directly to the surface of first material layer 14. In this embodiment a mask is applied to the surface of first material layer 14, the mask substrate is processed by the lithography step described above to form activated and non-activated portions of first material layer 14 after which the activated or non-activated portions are removed to form trench 22. One example of a first material 14 that exhibits photosensitive characteristics are polyimides. Photosensitive materials such as polyimides can be applied to first material layer 14 by conformal layer application processes such as by a spin coating.

Trench 22 may be formed by any method known in the art for controllably and uniformly removing a portion of a material layer from an integrated circuit or other substrate. Useful methods for selectively and controllably removing a material layer from a substrate include, for example, reactive ion etching, wet etching and plasma etching electrochemical etching and deep reactive ion etching. A preferred method to remove a portion of first material layer 14 to form trench 22 is reactive ion etching.

A second material layer 24 is deposited onto the surface of first material layer 14 in FIG. 2E. Second material layer 24 is a conformal layer meaning here that the exposed surface of second material layer 24 is non planar because it follows the general shape the surface that it is covering. Second material layer 24 is applied to exposed surface 16 of first material layer 14 in an amount sufficient to fill trench 22 to a depth that exceeds the height of surface 16 of first material layer 14. A second material layer 24 may be applied to the surface of substrate 10 by any means known in the art for applying a conformal layer to a substrate. Non limiting examples of such methods include spin coating, jet coating, chemical vapor deposition, physical vapor deposition, electroplating and so forth. If second material layer 24 is a malleable material, then the substrate can undergo a reflow process to reduce magnitude of the peaks and valleys after application of second material layer 24 to substrate 10.

A second photosensitive etch resistant material layer 26 is applied to exposed surface 25 of second material layer 24 and processed by the lithographic techniques described above in a manner that protects the second material layer 24 located above trench 22 from being removed by etching. FIG. 2F shows substrate 10 following lithography and includes a second photosensitive etch resistant material portion 26 located above trench 22. In this lithography step, a second mask is used to image second photosensitive etch resistant material layer 26. The second mask may have essentially the same geometry as the first mask used to image first photosensitive etch resistant material layer 18 or it may be a negative of the first mask depending upon the type of etch resistant material used.

In order to reduce the complexity of the substrate manufacturing process the first and second photosensitive etch resistant materials will be the same material. In this preferred embodiment, the second mask used to image a second photosensitive etch resistant material layer will be essentially the reversed version of the first mask except that some overlay or underlay may be present to accommodate local effects due to pattern density and immediate effects due to feature sizes, and also to accommodate photobias of photosensitive materials.

In FIG. 2G, unprotected portions 27 of second material layer 24, i.e., those portions of second material layer 24 that are not covered by the second photosensitive etch resistant material layer are removed from substrate 10 until second material layer surface 24 is removed to a predetermined level that is essentially level with the center of trench 20. As a result, a small amount of second material layer 24 can remain associated with surface 16 of first material layer 14 that do not define a trench or some other feature.

Unprotected portions 27 of second material layer 24 are typically removed by etching techniques. They may be alternatively removed by CMPs techniques if the selected photosenstive etch resistant material portion 26 is extremely hard and resistant to CMP. Otherwise, etching is the preferred method of removing unprotected portion 27 of second material layer 24 from substrate 10.

Finally, the exposed surface of substrate 10 shown in FIG. 2G is polished using chemical mechanical planarization techniques until second material layer 24 becomes coplanar with first material layer 14 to create feature 28. The portion of second photosensitive etch resistant material layer 26 remaining on the surface of second material layer 24 shown in FIG. 2G can be stripped from second material layer 24 prior to chemical mechanical planarization or it may be removed as part of the chemical mechanical planarization procedure.

Figure 3A:
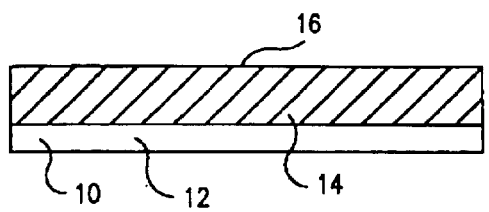
FIGS. 3A–3K are steps in an alternative embodiments of process of this invention for adding difficult to polish features to a substrate using reverse mask etching and CMP techniques.
Figure 3B:
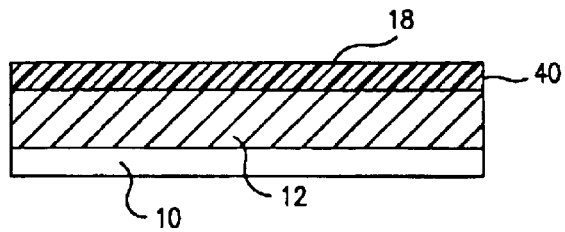
Figure 3C:
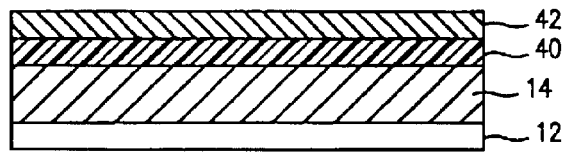
Figure 3D:
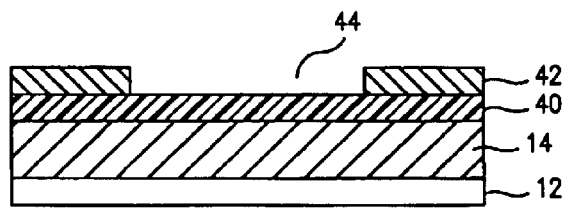
Figure 3E:
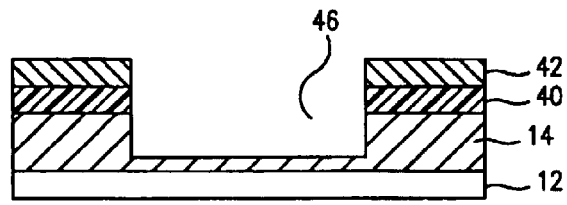
Figure 3F:
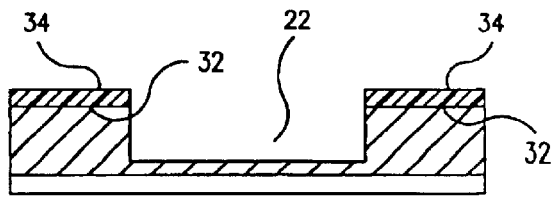
Figure 3G:
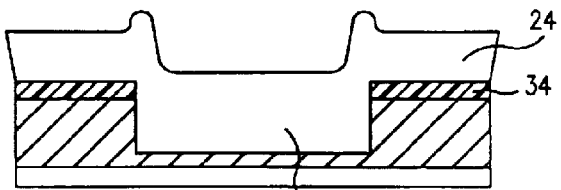
Figure 3H:
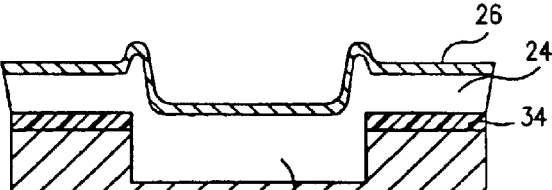
Figure 3I:
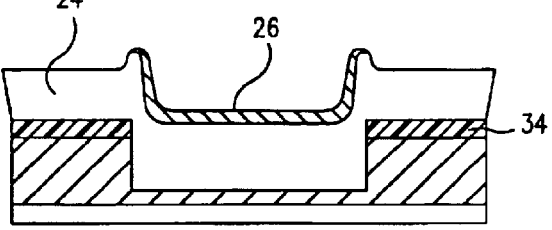
Figure 3J:
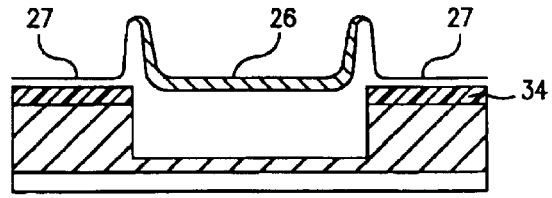
Figure 3K:
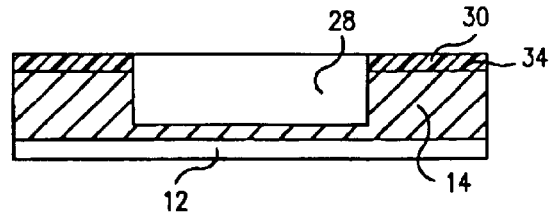

FIGS. 3A–3K are an alternative embodiment for the process steps shown in FIGS. 2A–2H. The process begins in FIG. 3A with the same substrate used in FIG. 2A. In the step shown in FIG. 3B, an etch and/or polishing stop material layer 40 is applied to the surface of substrate 10. In FIG. 3C, a photosensitive etch resistant material layer 42 applied to the surface of stop material layer 40. In FIG. 3D, the photosensitive etch resistant material layer 42, is exposed and developed to form an opening 44 that exposes the underlying stop layer material 40. In FIG. 3E, the exposed portion of stop layer 40 and the underlying first material layer 14 are etched to a predetermined level to create feature 46. At this point, the remaining photosensitive etch resistant material layer 42 can be removed from substrate 10 to form the substrate shown in FIG. 3F, or the processing of substrate 10 can continue.

Examples of useful stop materials include, but are not limited to polyimides, nitrides such as silicon nitride, polysilicon, silicon oxynitride (SiOn), silicon carbide (SiC), $Al_2O_3$, W, Ti, TiN, Ta, TaN, TiW, Mo or any other material that exhibits the desired stop material properties of etch and/or polishing resistance. The depth of stop layer 30 will depend upon the thickness and/or width of the feature being polished. Stop layer 30 may range from about 100 Å to about 1 micron in thickness. Preferably, stop layer 30 will have a thickness of from about 500 Å to about 5000 Å.

The remaining processing steps shown in FIGS. 3G–3K are essentially identical to those shown in FIGS. 2E–2H. The only difference is that second material layer 24 is planarized by CMP until it is planar with stop layer material 34. In an alternative embodiment, the photoresist layer portion 26 shown in FIG. 31 can be selected from a hard stop material layer that is imaged and etched to protect the underlying feature 22.

FIGS. 4A–4M are steps in alternative process of this invention for adding a feature to a substrate. The process depicted in FIGS. 4A–4M differs from the process depicted in FIGS. 2A–2H primarily in steps 4E through 4G in which a stop layer 30 is selectively applied to portions 32 of first material layer 14 in order to protect the exposed portions of first material layer 14 from being removed during the selective etching or CMP of second material layer 24 from substrate 10 in step 4K. Stop layer 30 may be any material that inhibits etching, that inhibits polishing, or both. For example, stop layer 30 may be chosen from a material that prevents first material layer 14 from being removed during selective etching of first or second material layer. Stop layer 30 may also be a polishing stop layer which protects first material layer from being overpolished during the CMP steps of the process of this invention.

Figure 4M:
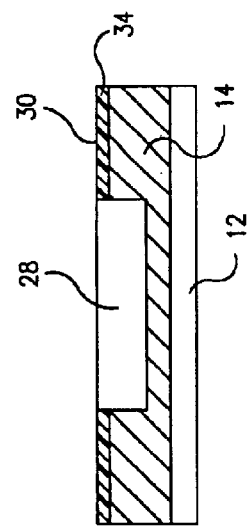
Figure 4J:
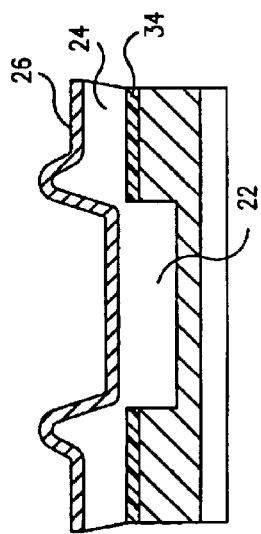
Figure 4K:
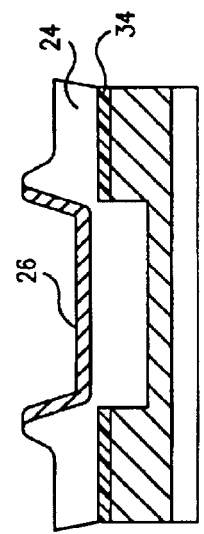
Figure 4L:
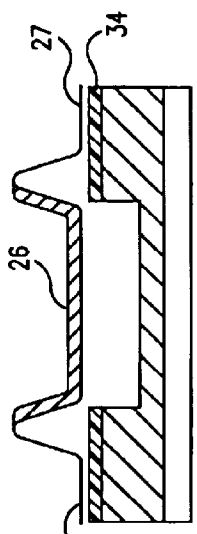
Figure 4G:
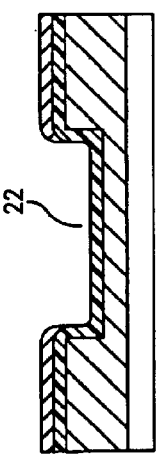

According to FIG. 4E, stop material 30 is applied as a layer to exposed surface 16 of first material layer 14. In FIG. 4F, a third photosensitive etch resistant material layer 33 is applied to the surface of etch stop material layer 30. A mask is placed over third photosensitive etch resistant layer 33 as shown in FIG. 4G and the photosensitive material is activated as in the lithographic techniques described above in a manner that causes stop layer 30 associated with exposed surface 16 of first material layer to remain while allowing for the removal of stop layer material 30 located in trench 22. The resulting substrate 10 includes a stop material layer portion 34 associated with first material layer 14 is shown in FIG. 4H.

Figure 4H:
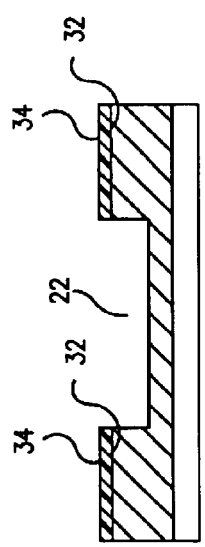
Figure 4I:
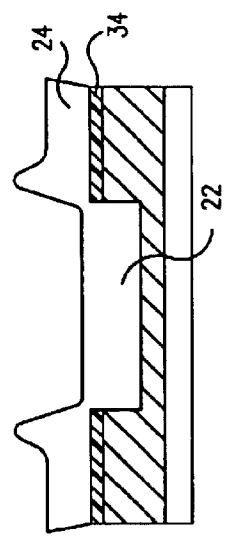

In a further optional embodiment of this invention, the process steps, shown in FIGS. 4G and 4H, of removing the portions of third photosensitive etch resistant layer 32 that remain after the lithography step is complete can be omitted. In this optional process embodiment, the remaining third photosensitive etch resistant material layer portions 34 will remain in place until they are removed by etching CMP techniques and/or following deposition of second material layer 24.

The processes of this invention are useful for manufacturing substrates including features with large step heights. The term "large step-height feature" refers to substrate features having a thickness of from about 2 to about 50 microns and more preferably from about 5 to about 15 microns. The processes of this invention are also useful for manufacturing substrates including large width features. The term "large width feature" refers to substrate features having width of from about 2 microns to about 30,000 microns and more preferably from about 10 to about 15,000 microns. In yet another embodiment, the process of this invention are useful for manufacturing substrates that include an area of low feature density adjacent to an area of high feature density.

Many useful electronic devices can be manufactured using the processes of this invention. The choice of device will largely determine the choice of materials used to manufacture the substrates. The processes of this invention are especially useful for manufacturing photonic light circuits (PLC's) and microoelctromechanisms (MEM's). PLC's are typically manufactured using materials that are light transparent or semi-transparent. When the processes of this invention are used to manufacture PLC's, the first and second materials will generally be a transparent organic or inorganic material such as silicon, silicon oxynitride, polysilicon, polyimides, polymethylmethacrylate, perfluorinated polymers and polyacrylics, or silicon dioxide ($SiO_2$), doped oxide such as Ge, Er, ZnO, $ZrO_2$, InP, GaN, GaAlN, and mixtures thereof. The second material will have a different refractive index than the first material.

With MEM's, the first material may be selected from a sacrificial materials such as, GaAs, polysilicon, SiN, polyimide, photoresists, $SiO_2$, Cu, Al, AlGa, As and mixtures thereof while the second structural material will be selected from a metal or an alloy such as copper, aluminum, tungsten, polysilicon, SiH, GaAs, diamond, nickel and nickel compounds and so forth and alloys thereof.

The processes of this invention all use chemical mechanical polishing techniques to planarize the second material layer. In a typical chemical mechanical planarization (CMP) process, the substrate surface that is being polished is placed into contact with a rotating polishing pad. A carrier applies pressure against the backside of the substrate. During the polishing process, the pad and table are rotated while a downward force is maintained against the substrate back. A polishing composition is applied to the interface between the polishing pad and the substrate surface being polished. The polishing composition can be applied to the interface by applying the polishing composition to the polishing pad surface, to the substrate surface being polished or both. The polishing composition can be applied to the interface either intermittently or continuously and the application of the polishing composition can begin prior to or after the polishing pad is brought into contact with the substrate surface being polished. Finally, the term "applying a polishing composition" as it used in the specification and claims is not time limited and refers to the application of a polishing composition either before or after a polishing substrate is moved into contact with the surface being polished.

The polishing process further requires an abrasive material to assist in removing a portion of the substrate surface that has been softened by a reaction between the polishing composition and the substrate surface material. The abrasive may be incorporated into the polishing pad such as polishing pads disclosed in U.S. Pat. No. 6,121,143 which is incorporated herein by reference, it may be incorporated into the polishing composition, or both. Ingredients in the polishing composition or slurry initiate the polishing process by chemically reacting with the material on the surface of the substrate that is being polished. The polishing process is facilitated by the movement of the pad relative to the substrate as the chemically reactive polishing composition or slurry is provided to the substrate/pad interface. Polishing is continued in this manner until the desired film or amount of film on the substrate surface is removed.

The movement of the polishing pad in relationship to the substrate can vary depending upon the desired polishing end results. Often, the polishing pad substrate is rotated while the substrate being polished remains stationary. Alternatively, the polishing pad and the substrate being polished can both move with respect to one another. The polishing substrates and in particular the polishing pads of this invention can be moved in a linear manner, they can move in a orbital or a rotational manner or they can move in a combination of the directions.

The polishing composition is formulated to include chemicals that react with and soften the surface of the material being polished. The choice of polishing composition or slurry is an important factor in the CMP step. Depending on the choice of ingredients such as oxidizing agents, film forming agents, acids, bases, surfactants, complexing agents, abrasives, and other useful additives, the polishing slurry can be tailored to provide effective polishing of the substrate layer(s) at desired polishing rates while minimizing surface imperfections, defects and corrosion and erosion. Furthermore, the polishing composition may be selected to provide controlled polishing selectivities to other thin-film materials used in substrate manufacturing.

Examples of CMP polishing compositions and slurries are disclosed, in U.S. Pat. Nos. 6,068,787, 6,063,306, 6,033,596, 6,039,891, 6,015,506, 5,954,997, 5,993,686, 5,783,489, 5,244,523, 5,209,816, 5,340,370, 4,789,648, 5,391,258, 5,476,606, 5,527,423, 5,354,490, 5,157,876, 5,137,544, 4,956,313, the specifications of each of which are incorporated herein by reference.

The present invention has been described by means of specific embodiments, that would be understood that modifications may be made without departing from the spirit of the invention. The scope of the invention is not to be considered as limited by the description of the invention as set forth in the specification and examples, but rather as defined by the following claims.

What is claimed is:

1. A method for adding a feature to a substrate comprising the steps of:
   a. providing a substrate having a base material layer and a first material layer applied on top of the base material layer wherein the first material layer has a thickness of at least about 2 microns wherein the first material layer has an exposed surface;
   b. forming a feature in the first material layer;
   c. depositing a second material layer onto the surface of the first material layer in an amount that is sufficient to fill the first material layer feature;
   d. depositing a photosensitive etch resistant material layer onto the exposed surface of the second material layer;
   e. placing a mask over the photosensitive etch resistant material layer deposited onto the exposed surface of the second material layer to form exposed portions of the photosensitive etch resistant material layer deposited onto the exposed surface of the second material layer and unexposed portions of the photosensitive etch resistant material layer deposited onto the exposed surface of the second material layer;
   f. imaging the exposed portions of the photosensitive etch resistant material layer deposited onto the exposed surface of the second material layer to form activated portions and non-activated portions of the photosensitive etch resistant material layer; and
   g. planarizing the surface of the substrate by chemical mechanical polishing.

2. The method of claim 1 wherein the photosensitive etch resistant material deposited onto the exposed surface of the second material layer is a stop material selected from an etch stop material and a polishing stop material.

3. The method of claim 1 wherein a feature is formed in first material layer by the further steps comprising:
   i. depositing a photosensitive etch resistant material layer onto the exposed surface of the first material layer;
   ii. placing a mask on the photosensitive etch resistant material layer deposited onto the exposed surface of the first material layer wherein the mask covers portions of the photosensitive etch resistant material layer deposited onto the exposed surface of the first material layer to form covered portions of the photosensitive etch resistant material layer deposited onto the exposed surface of the first material layer and wherein the mask leaves portions of the photosensitive etch resistant material layer deposited onto the exposed surface of the first material layer exposed to form exposed portions of the photosensitive etch resistant material layer deposited onto the exposed surface of the first material layer.

iii. imaging the exposed portions of the photosensitive etch resistant material deposited onto the exposed surface of the first material layer to form activated portions and non-activated portions of the photosensitive etch resistant material layer deposited onto the exposed surface of the first material layer;

iv. removing a portion of the photosensitive etch resistant material layer deposited onto the exposed surface of the first material layer to expose the first material layer; and v. etching the exposed first material layer to form a feature.

4. The method of claim 3 wherein the photosensitive etch resistant material layer deposited onto the exposed surface of the first material layer is removed from the material layer surface to expose the first material layer surface before depositing the second material layer onto the surface of the first material layer.

5. The method of claim 1 wherein the photosensitive etch resistant material layer deposited onto the exposed surface of the second material layer is removed following step (f) by a etching, by chemical mechanical planarization or by a combination thereof.

6. The method of claim 1 wherein the mask applied in step (e) includes underlayed portions, overlayed portions or both underlayed and overlayed portions.

7. The method of claim 1 wherein a portion of the photosensitive etch resistant material layer deposited onto the exposed surface of the second material layer is removed to expose at least a portion of the second material layer.

8. The method of claim 7 wherein at least a portion of the exposed second material layer is removed from the substrate prior to planarization step (g).

9. The method of claim 1 wherein the photosensitive material layer deposited onto the exposed surface of the second material layer that lies above the feature is removed from the substrate prior to planarizing step (g).

10. The method of claim 1 wherein the substrate is planarized in step (g) until the first material surface is essentially co-planar with the surface of the second material located in the feature.

11. The method of claim 3 wherein the mask applied to the second material layer is essentially a negative of the mask applied to the first material layer.

12. The method of claim 11 wherein the photosensitive etch resistant materials layer deposited onto the exposed surface of the first material layer and the photosensitive etch resistant material layer deposited onto the exposed surface of the second material layer are both positive acting or they are both negative acting.

13. The method of claim 1 wherein the feature is selected from a large step-size feature, a large width feature, an area of a substrate surface having a high density of features adjacent to a low density of features and combinations thereof.

14. The method of claim 1 wherein the feature is a large step-height feature.

15. The method of claim 1 wherein the feature is a large width feature.

16. The method of claim 1 wherein a stop material layer is applied to the substrate following step (a) by the further steps comprising:

(i) applying a stop material layer to the substrate surface;

(ii) depositing a photosensitive etch resistant material layer onto the surface of the stop material layer;

(iii) placing a mask over the photosensitive etch resistant material layer deposited onto the surface of the stop material layer wherein the mask covers portions of the photosensitive etch resistant material layer deposited onto the surface of the stop material layer and wherein the mask exposes portions of the photosensitive etch resistant material layer deposited onto the surface of the stop material layer;

(iv) imaging the exposed portions of the photosensitive etch resistant material layer deposited onto the surface of the stop material layer to form activated and non-activated portions of the photosensitive etch resistant material layer deposited onto the surface of the stop material layer;

(v) removing a portion of the photosensitive etch resistant material layer deposited onto the surface of the stop material layer that lies in the feature to expose the stop material layer associated with the feature; and (vi) removing the exposed stop material layer from the substrate.

17. The method of claim 3 wherein a stop material layer is applied to the substrate either prior to step (i) or following step (v).

18. The method of claim 1 wherein the substrate is a photonic light circuit.

19. The method of claim 15 wherein the second material is a light transparent material.

20. The method of claim 19 wherein the second material has a refractive index that is different from the refractive index of the first material.

21. The method of claim 1 wherein the substrate is a microelectromechanism.

22. The method of claim 20 wherein the first material layer and the second material layer are each selected from the group consisting of a sacrificial material or a structural material wherein the first material layer and the second material layer are not selected from the same material.

23. The method of claim 1 wherein chemical mechanical polishing step (l) comprises the further steps of:

(i) applying a polishing composition to the second material layer; and (ii) removing at least a portion of second material layer from the substrate by bringing a polishing substrate into contact with the second material layer surface and thereafter moving the polishing substrate in relation to the substrate.

24. The method of claim 23 wherein the polishing substrate is a fixed polishing pad.

25. The method of claim 24 wherein the polishing pad is a fixed abrasive polishing pad.

26. The method of claim 23 wherein the polishing composition includes abrasive particles.

27. The method of claim 23 wherein the polishing composition selectively polishes the second material layer.

28. The method of claim 1 where the feature applied to the substrate is a large step height feature having a height of from about 2 to about 50 microns.

29. A method for introducing a feature into an electronic substrate during its manufacture comprising the steps of:

a. providing a substrate having a base material layer and a first material layer applied on top of the base material layer wherein the first material layer has a thickness of at least 2 microns and wherein the first material layer has an exposed surface;

b. depositing a photosensitive etch resistant material layer onto the exposed surface of the first material layer;

c. forming a first mask over the photosensitive etch resistant material layer deposited onto the exposed surface of the first material layer wherein the mask covers portions of the photosensitive etch resistant material layer deposited onto the exposed surface of the first material layer to form covered portions of the photosensitive etch resistant material layer deposited onto the exposed surface of the first material layer and wherein the mask leaves portions of the photosensitive etch resistant material layer deposited onto the exposed surface of the first material layer exposed to form exposed portions of the first photosensitive etch resistant material layer;

d. imaging the exposed portions of the photosensitive etch resistant material deposited onto the exposed surface of the first material layer to give activated portions and non-activated portions of the photosensitive etch resistant material layer deposited onto the exposed surface of the first material layer;

e. removing a portion of the photosensitive etch resistant material layer deposited onto the exposed surface of the first material layer to expose the first material layer;

f. etching the exposed portions of the first material layer to form a feature;

g. removing the photosensitive etch resistant material layer deposited onto the exposed surface of the first material layer from the substrate to expose the first material layer surface;

h. applying a stop material layer to the first material layer surface;

i. depositing a photosensitive etch resistant material layer onto the surface of the stop material layer;

j. forming a mask over the photosensitive etch resistant material layer deposited onto the surface of the stop material layer wherein the mask covers portions of the photosensitive etch resistant material layer deposited onto the surface of the stop material layer and wherein the mask exposes portions of the photosensitive etch resistant material layer deposited onto the surface of the stop material layer;

k. imaging the exposed portions of the photosensitive etch resistant material layer deposited onto the surface of the stop material layer to form activated and non-activated portions of the photosensitive etch resistant material layer;

l. removing the portion of the photosensitive etch resistant material layer deposited onto the surface of the stop material layer that lies in the feature to expose the stop material layer associated with the feature;

m. removing the exposed stop material layer from the substrate;

n. depositing a second material layer onto the exposed substrate surface in an amount sufficient to fill the first material layer feature;

o. depositing a photosensitive etch resistant material layer onto the exposed surface of the first material layer;

p. forming a second mask over the photosensitive etch resistant material layer deposited onto the exposed surface of the second material layer to form exposed portions of photosensitive etch resistant material layer deposited onto the exposed surface of the second material layer and unexposed portions of photosensitive etch resistant material layer deposited onto the exposed surface of the second material layer;

q. imaging the exposed portions of the photosensitive etch resistant material layer deposited onto the exposed surface of the second material layer to form activated portions and non-activated portions of the photosensitive etch resistant material layer deposited onto the exposed surface of the second material layer;

r. removing the portion of the photosensitive etch resistant material layer deposited onto the exposed surface of the second material layer that does not lie above the feature to expose portions of the second material layer;

s. stripping at least a portion of the exposed second material layer from the substrate; and t. planarizing the surface of the substrate by chemical mechanical polishing.

30. The method of claim 29 wherein the chemical mechanical polishing step (t) comprises the further steps of:

(i) applying a polishing composition to the second material layer; and (ii) removing at least a portion of second material layer from the substrate by bringing a polishing substrate into contact with the second material layer surface and thereafter moving the polishing substrate in relation to the substrate.

* * * * *